(12) United States Patent
Ronkainen

(10) Patent No.: US 9,684,023 B2
(45) Date of Patent: Jun. 20, 2017

(54) RF MEASUREMENT DEVICE AND SYSTEM

(71) Applicant: Microsoft Technology Licensing, LLC, Redmond, WA (US)

(72) Inventor: Tapio Juhani Ronkainen, Sauvo (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 35 days.

(21) Appl. No.: 14/755,216

(22) Filed: Jun. 30, 2015

(65) Prior Publication Data
US 2017/0003333 A1    Jan. 5, 2017

(51) Int. Cl.
| | |
|---|---|
| G01R 27/04 | (2006.01) |
| G01R 29/10 | (2006.01) |
| H01Q 1/24 | (2006.01) |
| H04W 24/00 | (2009.01) |
| G01R 29/08 | (2006.01) |
| B25J 9/00 | (2006.01) |
| H01Q 1/10 | (2006.01) |
| G01R 31/00 | (2006.01) |

(Continued)

(52) U.S. Cl.
CPC .......... *G01R 29/0857* (2013.01); *B25J 9/003* (2013.01); *G01R 29/08* (2013.01); *G01R 29/0814* (2013.01); *G01R 29/0871* (2013.01); *G01R 29/10* (2013.01); *G01R 31/001* (2013.01); *H01Q 1/10* (2013.01); *G01R 31/2822* (2013.01); *H01Q 1/1235* (2013.01)

(58) Field of Classification Search
CPC  G01R 29/0857; G01R 29/08; G01R 29/0814; G01R 29/10; H01Q 1/10; H01Q 1/1235
USPC .................. 324/629; 343/703, 702; 455/423
See application file for complete search history.

(56) References Cited

U.S. PATENT DOCUMENTS

| | | |
|---|---|---|
| 6,525,657 B1 | 2/2003 | Wojcik |
| 7,583,089 B2 | 9/2009 | Onishim et al. |

(Continued)

FOREIGN PATENT DOCUMENTS

| | | |
|---|---|---|
| CN | 104089594 A | 10/2014 |
| EP | 2358504 A1 | 8/2011 |
| FR | 2964337 A1 | 3/2012 |

OTHER PUBLICATIONS

"PCTEST Engineering Laboratory, Inc", Apr. 23, 2015, Available at: http://fccid.net/pdf.php?id=23974.

(Continued)

*Primary Examiner* — Amy He

(57) ABSTRACT

A EUT (equipment under test) positioning device is disclosed. The device comprises a holder element configured to hold EUT, a sliding element configured to move the holder element horizontally, a rotating element attached to the sliding element and configured to rotate the holder element, at least three telescopic elements attached to the rotating element and configured to independently move the holder element vertically, at least five actuators individually attached to the sliding element, the rotating element and the telescopic elements, wherein the actuators are configured to activate movement of the sliding element, the rotating element and the telescopic elements, and a position monitoring element configured to monitor the position of EUT. The holder element, the sliding element, the rotating element, and the telescopic elements comprise radio frequency transparent material.

20 Claims, 3 Drawing Sheets

(51) Int. Cl.
    *H01Q 1/12*     (2006.01)
    *G01R 31/28*    (2006.01)

(56) References Cited

U.S. PATENT DOCUMENTS

| | | | |
|---|---|---|---|
| 8,872,080 | B2 | 10/2014 | Valenzuela et al. |
| 2004/0017115 | A1* | 1/2004 | Ozaki ................ G01R 29/0814 |
| | | | 307/149 |
| 2006/0012530 | A1* | 1/2006 | Onishi ............... G01R 29/0857 |
| | | | 343/702 |
| 2008/0261584 | A1 | 10/2008 | Qi et al. |
| 2011/0291433 | A1 | 12/2011 | Feng |
| 2011/0301591 | A1 | 12/2011 | Podhajsky et al. |
| 2014/0141726 | A1 | 5/2014 | Schlub et al. |
| 2016/0018438 | A1* | 1/2016 | Chou .................... G01R 29/10 |
| | | | 324/555 |

OTHER PUBLICATIONS

"TDK RF Solution Inc.", Apr. 23, 2015, Available at: http://tdkrfsolutions.com/images/uploads/brochures/TDK_Integrated_Test_Systems_Brochure.pdf.

"TDK RF Solutions", Published on: Sep. 4, 2012, Available at: http://www.ramayes.com/emc_test_software.htm.

"Testing System", Published on: Feb. 20, 2010, Available at: http://www.dineshmicrowaves.com/testing-system.html.

"Specific Absorption Rate (SAR) Requirements and Regulations in Different Regions", in Technical Report, Jul. 1999, 14 pages.

"An Automated SAR Measurement System for Compliance Testing of Personal Wireless Devices", in IEEE Transactions on Electromagnetic Compatibility, vol. 41, Issue 3, Aug. 1999, 12 pages.

"Specific Absorption Rate (SAR) Test Report", in Test Report TA592206-1-0-01, Jul. 30, 2009, 51 pages.

"IC SAR Test Report", in Proceedings of IC SAR Test Report, Jul. 30, 2012, 114 pages.

"International Search Report and Written Opinion Issued in PCT Application No. PCT/US2016/037725", Mailed Date: Sep. 26, 2016, 11 Pages.

"A Compliant Automatic SAR Testing System for Head and Body Worn Wireless Devices", Apr. 23, 2015, 8 pages Available at: http://www.indexsar.com/pdf/SARAC-1108.pdf.

"RF Safety SAR & HAC Test Benches", Apr. 23, 2015, 28 pages Available at: http://www.microwavevision.com/sites/www.microwavevision.com/files/files/MW%20GROUP_SAR_FINAL_0.pdf.

* cited by examiner

RF MEASUREMENT DEVICE AND SYSTEM

BACKGROUND

Specific Absorption Rate (SAR) testing is a requirement for mobile and portable radio transmitters. Governments around the world require that any wireless device should be evaluated to meet the radio frequency (RF) exposure limits set forth in the governmental SAR regulations. Specific Absorption Rate is the unit of measurement for the amount of radio frequency absorbed by the body when using a wireless device. SAR testing is performed by using phantoms to simulate a human head or body.

Common SAR test systems are designed to have a manual test layout. This requires test operator to manually enter values to test software and operate the base station simulator to establish a call to the equipment under test (EUT). Some systems have robotic elements such as movable measurement probes which can be placed in various parts of the phantom.

SUMMARY

The following presents a simplified summary of the disclosure in order to provide a basic understanding to the reader. This summary is not an extensive overview of the disclosure and it does not identify key/critical elements or delineate the scope of the specification. Its sole purpose is to present a selection of concepts disclosed herein in a simplified form as a prelude to the more detailed description that is presented later.

A device for positioning equipment under test (EUT) is presented. The device provides a fully automatic setup that can move the EUT in different directions, and monitor its position in real time. The device comprises RF transparent, or non-metallic, material so that it can be used in measurement of RF signals emitted by the EUT, for example in SAR testing. A system and method where the device can be used are also presented. The system provides a setup for SAR testing, and the method shows the sequence of a SAR test.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the embodiments and is not intended to represent the only forms in which the embodiments may be constructed or utilized. The description sets forth the functions and the sequence of operation steps. However, the same or equivalent functions and sequences may be accomplished by different embodiments not listed below.

Figure 1A:
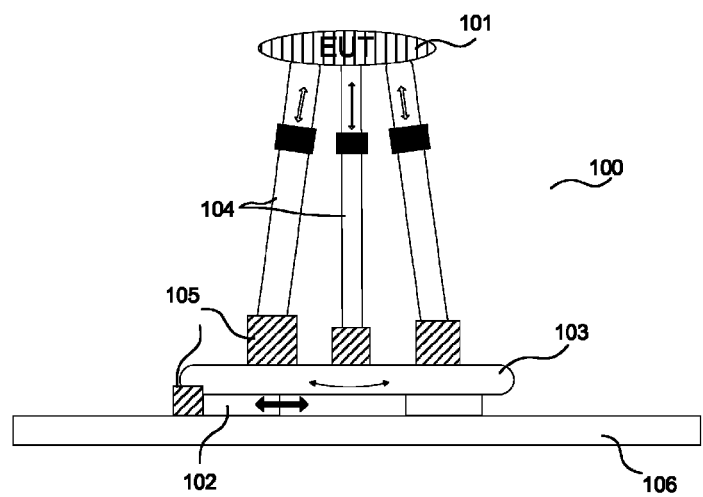
FIG. 1a is a schematic side view of a device according to an embodiment.
Figure 1B:
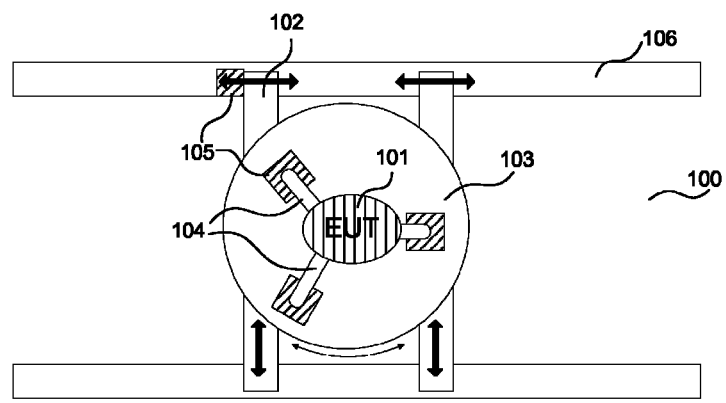
FIG. 1b is a schematic top view of a device according to an embodiment.

FIGS. 1a and 1b show an embodiment of a device 100 for positioning EUT. FIG. 1a is a side view and FIG. 1b is a top view of the device 100 according to the embodiment. The device 100 comprises a holder element 101 configured to hold the EUT in place. For example, the holder element 101 may comprise pins, mounts or any other appropriate parts to hold the EUT. In other embodiments, there may be more than one holder element 101 for repositioning more than one EUT in the device 100. The device 100 also comprises a sliding element 102 configured to move the device horizontally. The slider 102 may comprise rails along which the rest of the device 100 (including the holder 101 and EUT) in two horizontal directions simultaneously. This movement is illustrated by arrows and can be seen in the top view of FIG. 1b. The rails of the sliding element 102 may be paired, as shown, or single. Alternatively, any other sliding element 102 providing horizontal movement can be used.

The device 100 comprises a rotating element 103 configured to rotate the holder 101. The rotation can also be horizontal. The rotating element 103 may be implemented as a rotating disc, shown on FIGS. 1a and 1b. The three telescopic elements 104 shown on FIG. 1a are attached to the rotating element 103 and configured to independently move the holder element 101 vertically. The three telescopic elements 104 may form a tripod supporting the holder element 101 and moving it vertically. The vertical movement can be independent and coordinated, i.e. simultaneous or separate. The device 100 may also comprise more than three telescopic elements 104 to provide further setup and flexibility in movement.

The vertical movement can be achieved by retracting and protracting the telescopic elements 104. This movement can be used for raising and lowering the EUT, or for tilting the holder element 101 with EUT by moving some (and not all) of the telescoping elements simultaneously.

The device 100 further comprises at least five actuators 105 individually attached to the sliding element 102, the rotating element 103 and the telescopic elements 104. The actuators 105 are configured to activate movement of the other elements and may comprise step motors. FIGS. 1a and 1b only show 4 actuators 105 while the actuator that activates rotation of the element 103 is not shown. The device 100 also comprises a position monitoring element configured to monitor the position of the EUT. The monitoring element is not shown on FIGS. 1a and 1b because it may be implemented in different forms. In an embodiment, the position monitoring element may be a laser scanner or a distance meter. Alternatively or in addition, the device 100 may have more than one position monitoring element. For example, position monitoring elements may be attached individually to each of the actuators 105, and they may comprise encoders for monitoring the position of each moving element separately.

Elements of the device 100 such as the holder 101, the sliding element 102, the rotating element 103, and the telescopic elements 104 comprise radio frequency transparent material. This material may be plastic, wood fiber, wood or any other non-metallic material. By "radio frequency transparent material" is meant a material which does not impede or interfere with propagation of waves at radio frequencies. The listed elements may be fully or partially made of these materials. In an embodiment, the material of the elements is chosen such that there are no metal parts within 30 centimeters from the EUT.

According to an embodiment, the height of the telescopic elements 104 may be between 350 millimeters and 560 millimeters from the top of the rotating element 103.

In an embodiment, the device 100 comprises a control element configured to instruct the actuators 105 to activate movement, and to collect information about the position monitored by the position monitoring element. The information gathered by the position monitoring elements may be used by the control element to control the position of the device 100, estimate its future position and return it to the original "zero" position.

The control element of the device 100 may comprise one or more processors which may be microprocessors, controllers or any other suitable type of processors for processing computer executable instructions to control the operation of the device 100. Platform software comprising an operating system or any other suitable platform software may be provided at the device 100 to enable application software to be executed on the device.

Computer executable instructions may be provided using any computer-readable media that is accessible by the device 100. Computer-readable media may include, for example, computer storage media such as memory and communications media. Computer storage media, such as memory includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Therefore, a computer storage medium should not be interpreted to be a propagating signal per se. Propagated signals may be present in a computer storage media, but propagated signals per se are not examples of computer storage media.

At least some of the embodiments disclosed in FIGS. 1a and 1b can provide the technical effect of efficient control of movement of the EUT within a SAR test chamber. The movement can be done independently in different dimensions (up, down, tilt, horizontally including rotation).

Figure 2:
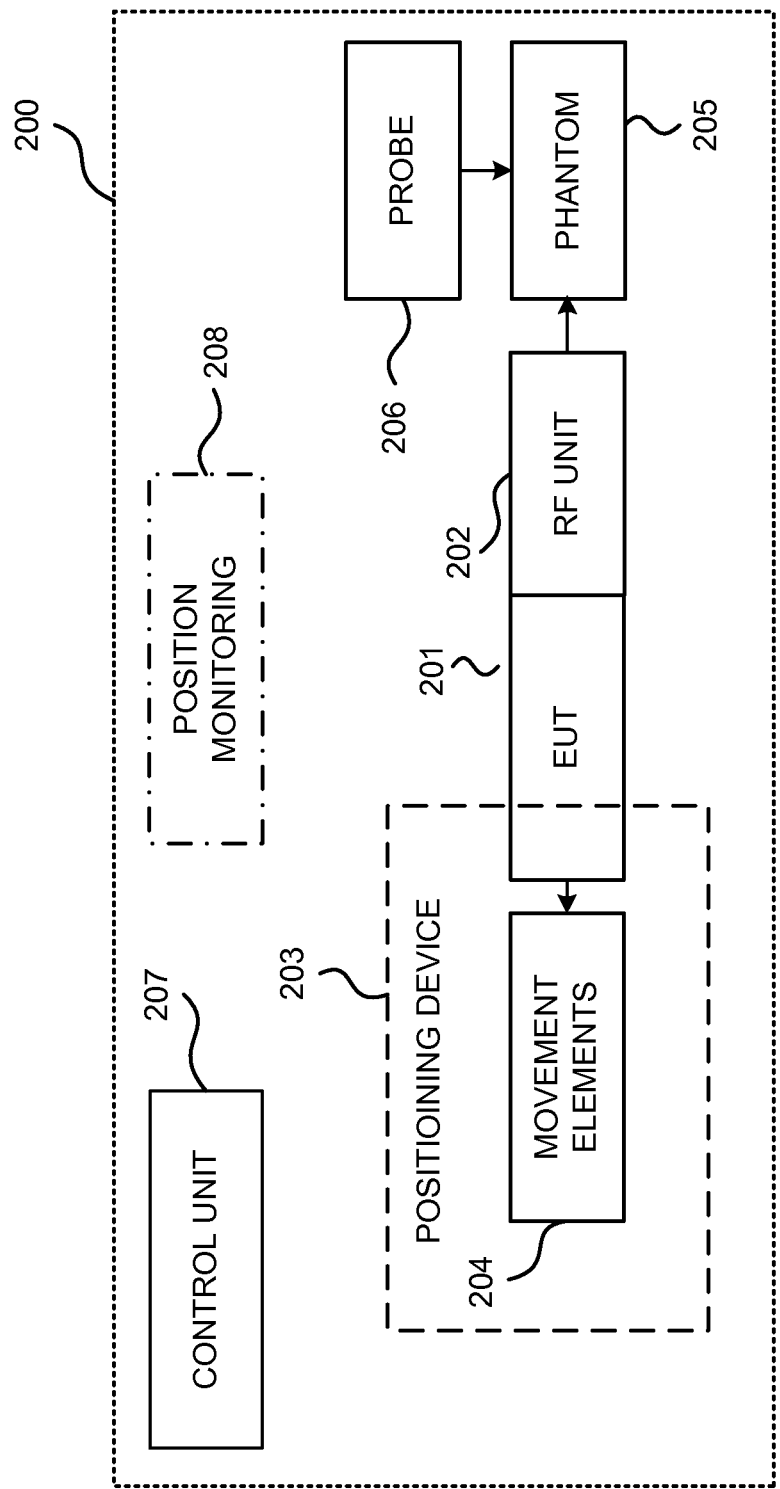
FIG. 2 is a block diagram of a system according to an embodiment.

FIG. 2 shows a system 200 according to an embodiment of the invention. The system 200 may be an SAR testing system or a system for testing RF emission of equipment under test. The system 200 comprises equipment under test 201. The EUT 201 may be a mobile device such as a mobile phone, a portable computer, a tablet or any other device for which RF emission needs to be measured. The EUT 201 comprises a wireless unit 202 which may be capable of emitting RF radiation. In an embodiment, the wireless unit 202 can be a cellular antenna, a Wi-Fi™ antenna or any other element which emits RF radiation. The system 200 further comprises a positioning device 203 with movement elements 204 as well as other elements. The positioning device 203 comprises: a holder element configured to hold the equipment under test, a sliding element configured to move the holder element horizontally, a rotating element attached to the sliding element and configured to rotate the holder element, at least three telescopic elements attached to the rotating element configured to independently move the holder element vertically, and at least five actuators individually attached to the sliding element, the rotating element and the telescopic elements. These elements constitute movement elements 204. The device 203 also comprises a position monitoring element configured to monitor the position of the equipment under test. In an embodiment, the positioning device 203 can be the device 100 described above in relation to FIGS. 1a and 1b.

The system 200 also comprises a phantom unit 205. The phantom unit 205 may comprise tissue which simulates human tissue. In an embodiment, the EUT 201 is a mobile phone, and the phantom unit is used to simulate a human head next to EUT 201 during a mobile phone call. The system 200 comprises a measuring unit 206 configured to measure RF emissions of the wireless unit 202 of the equipment under test 201. According to embodiments, the measuring unit 206 can comprise a probe and/or a sensor. The measuring unit 206 may also be movable. In an embodiment, the measuring unit is configured to measure radio frequency signals of the wireless unit of the equipment under test from at least one position inside of the phantom unit. Alternatively, a probe 206 may be positioned behind the phantom in relation to the EUT 201. The principle behind SAR testing using the system 200 according to an embodiment can be that the measuring unit 206 measures RF emission, for example by measuring electric field within the phantom 205. This can simulate the absorption rate of e.g. a user's head when the EUT 201 is used. The arrows on FIG. 2 illustrate the connection between units. The EUT 201 is placed on the positioning device 203, e.g. onto its holder element. The wireless unit 202 emits RF signal which is then registered by the measuring unit 206 through the phantom unit 205. In an embodiment, the system also comprises an additional measurement unit (not shown on FIG. 2) configured to monitor the spectrum of the RF signal transmitted from EUT.

The system 200 comprises a control unit 207 configured to operate the positioning device 203 and the measuring unit 206. The control unit 207 may comprise a processor and be configured to run specific absorption rate testing sequences.

In an embodiment, the system 200 may also comprise a position monitoring unit 208. This unit may be implemented as part of the positioning device 203, for example like in the embodiments described with reference to FIGS. 1a and 1b. Alternatively the position monitor 208 may be a unit separated from the device 203 and comprise, for example, a laser scanner or a distance meter. The unit 208 may be used to monitor the position of the EUT in real time during the test, and the control unit 207 may use this information to correct the movement or predict the next steps.

Figure 3:
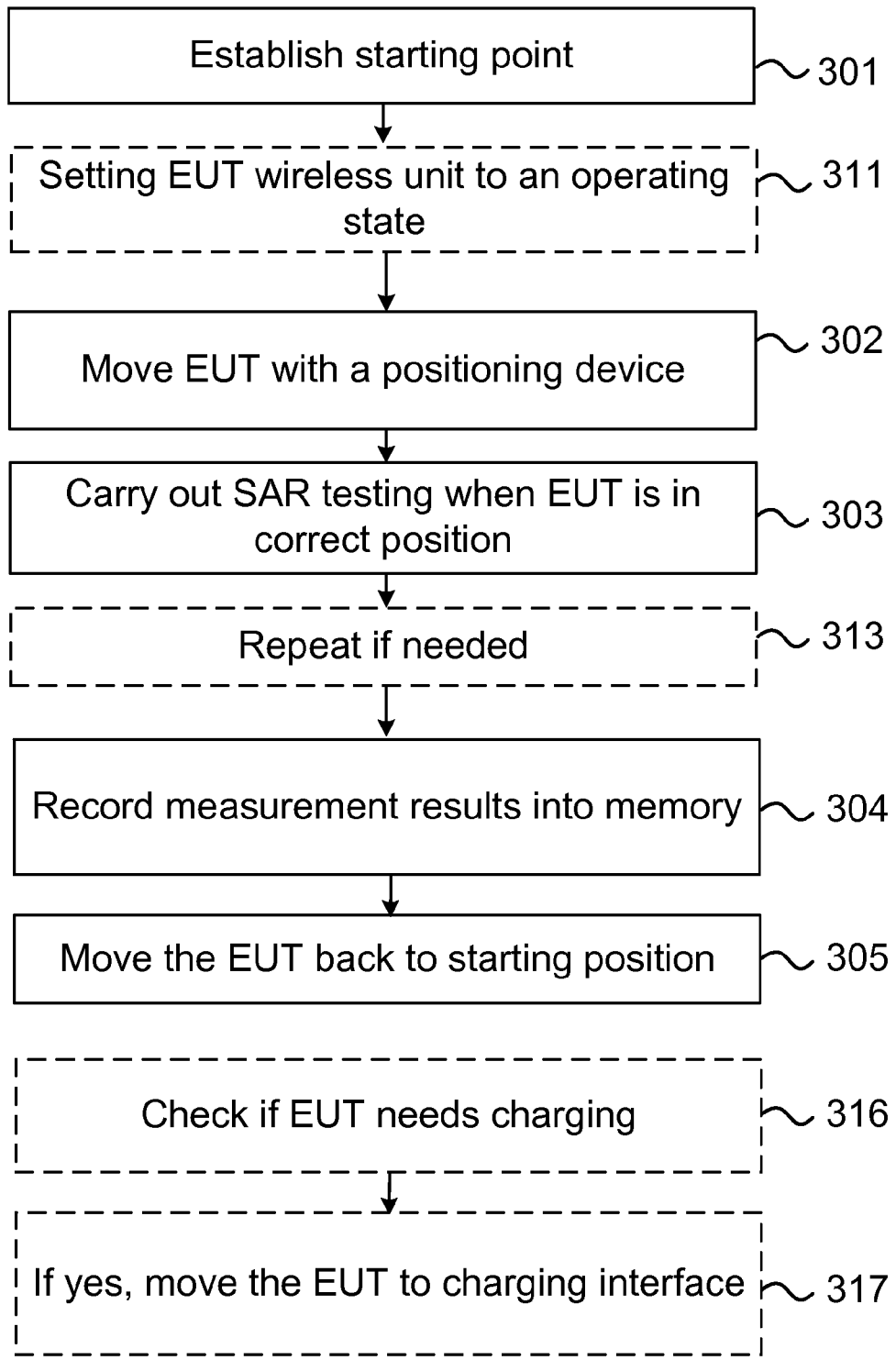
FIG. 3 is a flow chart of a method according to an embodiment.

FIG. 3 is a flow chart of a measurement method. The method may be a method for SAR measurement and may be performed by a control unit, for example by the control unit 207 of the system 200 described above. The method comprises establishing 301 a starting position for EUT, then moving 302 the EUT with a positioning device to a correct position. The positioning device comprises a holder element configured to hold the equipment under test, a sliding element configured to move the holder element horizontally, a rotating element attached to the sliding element and configured to rotate the holder element, at least three telescopic elements attached to the rotating element configured to independently move the holder element vertically, at least five actuators individually attached to the sliding element, the rotating element and the telescopic elements, and a position monitoring element configured to monitor the position of the EUT. The positioning device may be for example the device 100 shown in FIGS. 1a and 1b. For example, actuators of the device may be instructed to turn a certain amount of degrees which can be verified by using encoders as position monitoring elements to count pulses for each turned degree.

The method further comprises carrying out 303 an SAR measurement with a measuring unit when the EUT is in a correct position. In an embodiment wherein SAR measurement is performed for a mobile phone, this can comprise establishing a call with a desired band and channel, building a code to be sent to the measuring unit, sending the code to the measuring unit, awaiting while the measuring unit the measurement unit to complete the measurement and disconnecting the call. The method may also comprise optionally checking the result data and repeating 313 the measurement if needed. This retry 313 may be needed in case of a call drop or any other RF signal error.

Measurement results are then recorded 304 into a memory, and then moving 305 the equipment under test with the positioning device back to the starting position. All moving actions in this method may include sending instructions to elements of the positioning device to perform movement.

The method also optionally includes checking 316 if the EUT needs charging, for example by comparing current time to the last time the EUT was charged or by other means. If EUT needs charging, it is moved 317 with the positioning device to a charging interface. In an embodiment, the charging interface can be connected to a remote controlled power supply, wherein power is turned on and the charging current is monitored, so when the charging current drops the charging is considered to be completed and the sequence may be continued.

In an embodiment wherein SAR measurement is performed for a wireless local area network (WLAN) unit of the EUT, the method may comprise moving the EUT to a WLAN control interface, setting 311 the WLAN mode of the EUT wireless unit to an operating state, verifying that the operating state is correct by measuring the WLAN output with a spectrum analyzer, and then moving 302 the EUT with a positioning device to a correct position and performing 303 SAR testing. Blocks 311, 313, 316 and 317 are indicated by dashed lines because they are optional.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals may be present in a tangible storage media, but propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The embodiments described above may have the technical effect of allowing fully automated SAR testing which do not require an operator present to start each sequence. Another technical effect the above embodiments may be increased control over the process because position of the EUT can be monitored during the test, providing high repeatability. The accuracy and flexibility of process achieved using the above embodiments are improved due the above.

According to an aspect, a positioning device is provided. The device comprises: a holder element configured to hold an equipment under test, a sliding element configured to move the holder element horizontally, a rotating element attached to the sliding element and configured to rotate the holder element, at least three telescopic elements attached to the rotating element and configured to independently move the holder element vertically, at least five actuators individually attached to the sliding element, the rotating element and the telescopic elements, wherein the actuators are configured to activate movement of the sliding element, the rotating element and the telescopic elements, and a position monitoring element configured to monitor the position of the equipment under test. The holder element, the sliding element, the rotating element, and the telescopic elements comprise radio frequency transparent material.

In an embodiment, the device comprises three telescopic elements, wherein the three telescopic elements form a tripod.

In an embodiment, additionally or alternatively to the above embodiments, each actuator comprises a step motor.

In an embodiment, additionally or alternatively, the position monitoring element is selected from: a laser scanner and a distance meter.

In an embodiment, additionally or alternatively to the above embodiments, the device comprises at least five position monitoring elements individually attached to the actuators.

In an embodiment, additionally or alternatively to the above embodiments, each position monitoring element comprises a rotary encoder.

In an embodiment, additionally or alternatively to the above embodiments, the sliding element comprises at least one horizontal rail.

In an embodiment, additionally or alternatively to the above embodiments, the radio frequency transparent material is selected from: plastic and wood.

In an embodiment, additionally or alternatively to the above embodiments, the device comprises a control element configured to instruct the actuators to activate movement, and to collect information about the position monitored by the position monitoring element.

In an embodiment, additionally or alternatively to the above embodiments, the control element comprises a processor and a memory.

In an embodiment, additionally or alternatively to the above embodiments, the telescopic elements attached to the rotating element are configured to tilt the holder element.

In an embodiment, additionally or alternatively to the above embodiments, the height of the telescopic elements is between 35 and 56 centimeters.

According to an aspect, a system is disclosed. The system comprises: an equipment under test comprising a wireless unit; a positioning device which comprises: a holder element configured to hold the equipment under test, a sliding element configured to move the holder element horizontally, a rotating element attached to the sliding element and configured to rotate the holder element, at least three telescopic elements attached to the rotating element and configured to independently move the holder element vertically, at least five actuators individually attached to the sliding element, the rotating element and the telescopic elements, and a position monitoring element configured to monitor the position of the equipment under test; a phantom unit; a measuring unit configured to measure radio frequency signals of the wireless unit of the equipment under test; and a control unit configured to operate the positioning device and the measuring unit.

In an embodiment, the wireless unit of the equipment under test comprises a cellular antenna.

In an embodiment, additionally or alternatively to the above embodiments, the equipment under test is a mobile device.

In an embodiment, additionally or alternatively to the above embodiments, the measuring unit is configured to measure radio frequency signals of the wireless unit of the equipment under test from at least one position inside of the phantom unit.

In an embodiment, additionally or alternatively to the above embodiments, the phantom unit comprises tissue which simulates human tissue.

In an embodiment, additionally or alternatively to the above embodiments, the control unit comprises a processor and is configured to run specific absorption rate testing sequences.

According to an aspect, a measurement method is presented. The method comprises: establishing a starting position for an equipment under test; moving the equipment under test with a positioning device, the device comprising: a holder element configured to hold the equipment under test, a sliding element configured to move the holder element horizontally, a rotating element attached to the sliding element and configured to rotate the holder element, at least three telescopic elements attached to the rotating element and configured to independently move the holder element vertically, at least five actuators individually attached to the sliding element, the rotating element and the telescopic elements, and a position monitoring element configured to monitor the position of the equipment under test; carrying out a specific absorption rate measurement with a measuring unit; recording results of the measurement into a memory; and moving the equipment under test with the positioning device back to the starting position.

In an embodiment, the method additionally comprises checking if the equipment under test requires charging; and if the equipment under test requires charging, moving the equipment under test with the positioning device to a charging interface.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the technical effects described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term 'comprising' is used herein to mean including the method blocks or elements identified, but that such blocks or elements do not comprise an exclusive list and a method or device may contain additional blocks or elements.

It will be understood that the above description is given by way of example only and that various modifications may be made by those skilled in the art. The above specification, embodiments and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A positioning device comprising:
a holder element that holds an equipment under test;
a sliding element that moves the holder element horizontally;
a rotating element, attached to the sliding element, that rotates the holder element;
at least three telescopic elements, attached to the rotating element, that independently move the holder element vertically;
at least five actuators, individually attached to the sliding element, the rotating element and the at least three telescopic elements, wherein the at least five actuators activate movement of the sliding element, the rotating element and the at least three telescopic elements; and
a position monitoring element that monitors the position of the equipment under test, wherein the holder element, the sliding element, the rotating element, and the at least three telescopic elements comprise radio frequency transparent material.

2. The positioning device as claimed in claim 1 comprising three telescopic elements, wherein the three telescopic elements form a tripod.

3. The positioning device as claimed in claim 1, wherein an actuator of the at least five actuators comprises a step motor.

4. The positioning device as claimed in claim 1, wherein the position monitoring element is selected from: a laser scanner or a distance meter.

5. The positioning device as claimed in claim 1 comprising at least five position monitoring elements individually attached to the at least five actuators.

6. The positioning device as claimed in claim 5, wherein a position monitoring element of the at least five position monitoring elements comprises a rotary encoder.

7. The positioning device as claimed in claim 1, wherein the sliding element comprises at least one horizontal rail.

8. The positioning device as claimed in claim 1, wherein the radio frequency transparent material is selected from: plastic or wood.

9. The positioning device as claimed in claim 1 comprising a control element that instructs the at least five actuators to activate movement, and to collect information about the position monitored by the position monitoring element.

10. The positioning device as claimed in claim 9, wherein the control element comprises a processor and a memory.

11. The positioning device as claimed in claim 1, wherein the at least three telescopic elements attached to the rotating element are configured to tilt the holder element.

12. The positioning device as claimed in claim 1, wherein the height of the at least three telescopic elements is between 35 and 56 centimeters.

13. A system comprising:
a positioning device which comprises: a holder element that holds an equipment under test; a sliding element that moves the holder element horizontally; a rotating element, attached to the sliding element, that rotates the holder element; at least three telescopic elements, attached to the rotating element, that independently move the holder element vertically; at least five actuators, individually attached to the sliding element, the rotating element and the at least three telescopic elements; and a position monitoring element that monitors the position of the equipment under test, the equipment under test comprising a wireless unit;
a phantom unit;
a measuring unit configured to measure radio frequency signals of the wireless unit of the equipment under test; and
a control unit configured to operate the positioning device and the measuring unit.

14. The system of claim 13, wherein the wireless unit of the equipment under test comprises a cellular antenna.

15. The system of claim 13, wherein the equipment under test is a mobile device.

16. The system of claim 13, wherein the measuring unit measures radio frequency signals of the wireless unit of the equipment under test from at least one position inside of the phantom unit.

17. The system of claim 13, wherein the phantom unit comprises tissue which simulates human tissue.

18. The system of claim 13, wherein the control unit comprises a processor that runs specific absorption rate testing sequences.

19. A measurement method comprising:
establishing a starting position for an equipment under test;
moving the equipment under test with a positioning device, the positioning device including a holder element that holds the equipment under test, a sliding element that moves the holder element horizontally, a rotating element attached to the sliding element that rotates the holder element, at least three telescopic elements attached to the rotating element and independently move the holder element vertically, at least five actuators individually attached to the sliding element, the rotating element and the at least three telescopic elements, and a position monitoring element that monitors the position of the equipment under test;
carrying out a specific absorption rate measurement with a measuring unit;
recording results of the specific absorption rate measurement into a memory; and
moving the equipment under test with the positioning device back to the starting position.

20. A method of claim 19 comprising:
checking if the equipment under test requires charging; and
responsive to a determination that the equipment under test requires charging, moving the equipment under test with the positioning device to a charging interface.

* * * * *